(12) United States Patent
Leu

(10) Patent No.: US 8,698,379 B2
(45) Date of Patent: Apr. 15, 2014

(54) PIEZOELECTRIC VIBRATING DEVICE CAPABLE OF HEAT DISSIPATION AND CONDUCTION

(75) Inventor: Wen-Tong Leu, Taipei (TW)

(73) Assignee: Datron Products Co., Ltd., Taipei (TW)

( * ) Notice: Subject to any disclaimer, the term of this patent is extended or adjusted under 35 U.S.C. 154(b) by 421 days.

(21) Appl. No.: 13/233,886

(22) Filed: Sep. 15, 2011

(65) Prior Publication Data

US 2012/0326567 A1 Dec. 27, 2012

(30) Foreign Application Priority Data

Jun. 22, 2011 (TW) .............................. 100121855 A

(51) Int. Cl.
*H01L 41/09* (2006.01)
(52) U.S. Cl.
USPC ...... 310/346; 310/311; 310/328; 310/323.01; 310/369
(58) Field of Classification Search
USPC .......... 310/311, 323.01–323.2, 328, 346, 369
See application file for complete search history.

(56) References Cited

U.S. PATENT DOCUMENTS

| | | | | |
|---|---|---|---|---|
| 3,069,573 A | * | 12/1962 | Van Liew | 310/351 |
| 3,255,401 A | * | 6/1966 | Koln et al. | 322/2 R |
| 4,423,768 A | * | 1/1984 | Edelman et al. | 165/84 |
| 6,049,160 A | * | 4/2000 | Safari et al. | 310/369 |
| 2011/0120679 A1 | * | 5/2011 | Tanaka | 165/121 |
| 2011/0223043 A1 | * | 9/2011 | Tanaka et al. | 417/410.1 |
| 2011/0235277 A1 | * | 9/2011 | Jang et al. | 361/700 |

* cited by examiner

*Primary Examiner* — Thomas Dougherty
(74) *Attorney, Agent, or Firm* — Meagher Emanuel Laks Goldberg & Liao, LLP

(57) ABSTRACT

A piezoelectric vibrating device comprises a metallic containing member, a piezoelectric member and a heat dissipating and conducting member. The piezoelectric member is provided within the metallic containing member, and the heat dissipating and conducting member includes a plurality of the heat dissipating and conducting fins. Each the heat dissipating and conducting fin has a first heat conduction connecting end and a second heat conduction connecting end, wherein the first heat conduction connecting end is provided on an external surface of the piezoelectric member, and the second heat conduction connecting end is connected with an inner wall surface of the metallic containing member. The piezoelectric member generates vibrations with specific polarization directions based on a piezoelectric controlling signal, and the heat energy generated from the vibration of the piezoelectric member is conducted to the external wall surface of the metallic containing member through the heat dissipating and conducting member.

10 Claims, 5 Drawing Sheets

PIEZOELECTRIC VIBRATING DEVICE CAPABLE OF HEAT DISSIPATION AND CONDUCTION

FIELD OF THE INVENTION

The present invention relates to a piezoelectric device, and more particularly to a piezoelectric vibrating device capable of heat dissipation and conduction.

BACKGROUND OF THE INVENTION

The device which applies voltage on a piezoelectric ceramic to generate vibration comprises an ultrasonic cleaning device, an ultrasonic welding device, an emulsifying device, etc. Ultrasonic cleaning, which is a cleaning method without pollution, uses an ultrasonic cavitation in a liquid to achieve the cleaning purpose. It can accelerate dissolution and also has a great effect of degasification in a liquid by means of ultrasonic wave, and thus it is used widely in the fields of mechanics, electronics, medicine, chemistry, etc.

The theory of ultrasonic cleaning is that a high frequency oscillation signal generated by ultrasonic cleaner is converted into a high frequency mechanical oscillation through a transducer, the oscillation is introduced into a cleanout fluid, and then ultrasonic wave thereof radiates in the cleanout fluid forward to make fluid move and generates tens of thousands of micro bubbles, and these bubbles are formed and generated in an negative pressure area and are rapidly closed in a positive pressure area during an ultrasonic propagation process, which is called cavitation. In cavitation, it can form instantaneous high pressure exceeding 1,000 atmosphere, and the continuously generated instantaneous high pressure bombs an object surface like a series of little explosion, so that dirt on the object surface and in gaps is peeled rapidly to achieve the cleaning effect.

An ultrasonic welding device is mainly used for welding a plastic workpiece closely, the welding head of which gets in touch with a processing part of the plastic workpiece and welds it by the ultrasonic vibration of an ultrasonic vibrator, and then makes it with good appearance.

An emulsifying device mainly uses a high frequency voltage signal transmitted from a circuit to convert electrical energy into mechanical energy through a transducer, and then convert two immiscible materials into an emulsion, wherein it has the different operating frequency according to the raw materials, and its theory mainly comprise a mechanical vibration effect, a convective transportation or stream, a cavitation effect, etc.

SUMMARY OF THE INVENTION

The piezoelectric ceramic has a vibrating effect when subjected to a voltage, however, heat energy is also generated when vibrating, and it causes the piezoelectricity of the piezoelectric ceramic becomes lower when the temperature becomes higher. More, since the temperature of the piezoelectric ceramic is higher than a specific temperature, e.g. Curie Temperature, it even causes the piezoelectric ceramic lose its piezoelectricity forever. Moreover, since the piezoelectric ceramic generates vibration by applying a voltage thereon, when the power of voltage applied is higher, the temperature generated by the piezoelectric ceramic will become higher, and thus it may cause a phenomenon of a depolarization or deterioration for the piezoelectric ceramic as described above.

With regard to the device using a piezoelectric ceramic to generate vibration, it is quite important for heat dissipation effect. However, there are not any substantial and effective improvements published in the market for heat dissipation being used for the ultrasonic cleaning device.

Furthermore, when the conventional ultrasonic cleaning device is placed in a cleaning tank, the piezoelectric ceramics disposed at two ends of the ultrasonic cleaning device receive the high frequency oscillation signals respectively, and then generate vibrations with the same polarization directions to form superimposition of the same amplitudes, that is, having same frequency in the same directions. Such oscillation mode can achieve the cleaning purpose of the object placed in the cleaning tank, but can not reach a better cleaning effect with a broader and ultra-precious cleaning area for an object to be cleaned up.

Thereby, an object of the present invention is to provide a piezoelectric vibrating device capable of heat dissipation and conduction that overcomes the defects existing in the prior arts.

Another object of the present invention is to provide a piezoelectric vibrating device capable of heat dissipation and conduction, which can be applied to all kind of ultrasonic vibrating devices using the piezoelectric ceramic.

The present invention overcomes the drawbacks of the prior art, and provides a piezoelectric vibrating device capable of heat dissipation and conduction comprising: a metallic containing member; a piezoelectric member provided within the metallic containing member; a heat dissipating and conducting member including a plurality of heat dissipating and conducting fins, each heat dissipating and conducting fin having a first heat conduction connecting end and a second heat conduction connecting end, the first heat conduction connecting end being provided on an external surface of the piezoelectric member and the second heat conduction connecting end being connected with an inner wall surface of the metallic containing member, wherein the piezoelectric member generates a vibration with a specific polarization direction based on a piezoelectric controlling signal, and the heat energy generated from the vibration of the piezoelectric member is conducted to the wall surface of the metallic containing member through the heat dissipating and conducting member.

In a preferred embodiment of the present invention, each of the heat dissipating and conducting fins of the heat dissipating and conducting member is provided around the external surface of the piezoelectric member, and each of the heat dissipating and conducting fins is disposed spacing from an adjacent one with a gap.

In a preferred embodiment of the present invention, the heat dissipating and conducting fins of the heat dissipating and conducting member are disposed spacing from each other along a helical path on the external surface of the piezoelectric member.

In a preferred embodiment of the present invention, the piezoelectric member is electrically connected with a piezoelectric controlling device, and the piezoelectric member is controlled by the piezoelectric controlling signal generated from the piezoelectric controlling device.

In a preferred embodiment of the present invention, the metallic containing member is made from a titanium metal material, a stainless metal material, an aluminum metal material, a copper metal material, or any metal materials with heat conduction.

Furthermore, in another preferred embodiment that the present invention overcomes the drawbacks of the prior art, and provides a piezoelectric vibrating device capable of heat dissipation and conduction comprising: a metallic containing member including a metallic connecting part and two metallic containing parts connected respectively with both ends of the metallic connecting part; two piezoelectric members provided within the metallic containing parts respectively; a heat dissipating and conducting member, provided on an external surface of the piezoelectric member, including a plurality of heat dissipating and conducting fins, each heat dissipating and conducting fin having a first heat conduction connecting end and a second heat conduction connecting end, the first heat conduction connecting end being provided on the external surface of the piezoelectric member, and the second heat conduction connecting end being connected with an inner wall surface of the metallic containing part, wherein the piezoelectric member generates a vibration with a specific polarization direction based on a piezoelectric controlling signal, and wherein the heat energy generated from the vibration of the piezoelectric member is conducted to the wall surface of the metallic containing member through the heat dissipating and conducting member.

In another preferred embodiment of the present invention, each of the heat dissipating and conducting fins of the heat dissipating and conducting member is provided around the external surface of the piezoelectric member, and each of the heat dissipating and conducting fins is disposed spacing from an adjacent one with a gap.

In another preferred embodiment of the present invention, the heat dissipating and conducting fins of the heat dissipating and conducting member are disposed spacing from each other along a helical path on the external surface of the piezoelectric member.

In another preferred embodiment of the present invention, the piezoelectric member is electrically connected with a piezoelectric controlling device, and the piezoelectric member is controlled by the piezoelectric controlling signal generated from the piezoelectric controlling device.

In another preferred embodiment of the present invention, the specific polarization direction of the vibration of one of piezoelectric members is a shrunk polarization direction, and the specific polarization direction of the vibration of the other of piezoelectric members is an expanded polarization direction when both of the piezoelectric members receive the piezoelectric controlling signals simultaneously.

The design of the present invention comprises: the heat dissipating and conducting member being provided on the external surface of the piezoelectric member; the heat conduction connecting end being connected with the inner wall surface of the metallic containing member; and the heat dissipating and conducting member including a plurality of heat dissipating and conducting fins being provided around or disposed spacing from each other on the external surface of the piezoelectric member. Thus, the heat energy generated from the vibration of the piezoelectric member can be rapidly conducted to the metallic wall surface of the metallic containing member through each of the heat dissipating and conducting fins, so as to effectively overcome the drawback of the conventional piezoelectric ceramic devices that the ultrasonic wave is unstable because the heat energy could not be discharged sufficiently.

By overcoming the drawback of the heat dissipation, the duration life of the devices using the piezoelectric ceramic to generate vibration, e.g. an ultrasonic cleaning device, an ultrasonic welding device, and an emulsifying device can be extended for a long time in the present invention. In addition, the cleaning effect of the ultrasonic cleaning device or the heat treating effect of the ultrasonic welding device and the emulsifying device can be more obvious because the heat energy is conducted effectively, and thus it can increase working efficiency of the devices.

Furthermore, when the piezoelectric vibrating device of the present invention is used as an ultrasonic cleaning device, the piezoelectric ceramics disposed at two ends of the ultrasonic cleaning device receive the high frequency oscillation signals, and then generate vibrations with the different polarization directions to form superimposition of the different amplitudes, that is, having different frequency in the different directions to generate the more complicated and multi-state vibrating directions. Thus, such oscillation mode can reach a better cleaning effect with a broader and ultra-precious cleaning area for an object to be cleaned up.

BRIEF DESCRIPTION OF THE DRAWINGS

The structure and the technical means adopted by the present invention to achieve the above and other objects can be best understood by referring to the following detailed description of the preferred embodiments and the accompanying drawings.

DETAILED DESCRIPTION OF THE PREFERRED EMBODIMENTS

Figure 1:
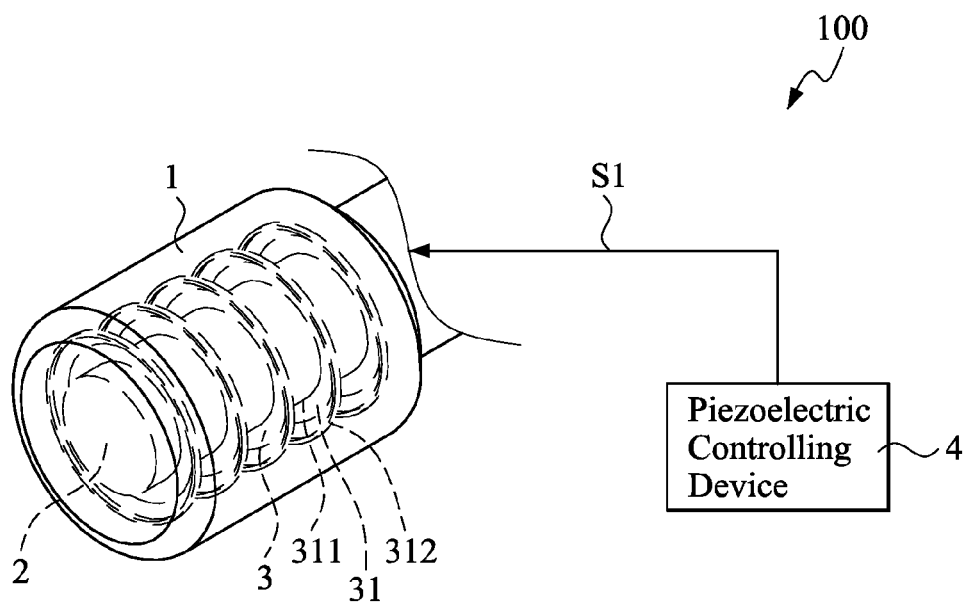
FIG. 1 is a sectional perspective view illustrating one embodiment according to the present invention.

Please refer to FIG. 1, which is a partial perspective view illustrating one embodiment according to the present invention. The piezoelectric vibrating device 100 of the present invention comprises a metallic containing member 1, a piezoelectric member 2 and a heat dissipating and conducting member 3. The piezoelectric member 2 is provided within the metallic containing member 1, and the heat dissipating and conducting member 3 includes a plurality of heat dissipating and conducting fins 31. Each heat dissipating and conducting fin 31 is provided around the external surface of the piezoelectric member 2, and each of the heat dissipating and conducting fins 31 is disposed spacing from an adjacent one with a gap. Furthermore, each of the heat dissipating and conducting fins 31 has a first heat conduction connecting end 311 and a second heat conduction connecting end 312. The first heat conduction connecting end 311 is provided on an external surface of the piezoelectric member 2, and the second heat conduction connecting end 312 is connected with an inner wall surface of the metallic containing member 1. In addition, the second heat conduction connecting end 312 of each of the heat dissipating and conducting fins 31 is disposed extending against to the inner wall surface of the metallic containing member 1, so that the heat dissipating and conducting fins 31 are all connected stably between the piezoelectric member 1 and the piezoelectric member 2.

In this embodiment, the metallic containing member 1 is made from a titanium metal material, a stainless metal material, an aluminum metal material, a copper metal material, or any metal materials with heat conduction.

The piezoelectric vibrating device 100 of the present invention further includes a piezoelectric controlling device 4 electrically connecting with the piezoelectric member 2. The piezoelectric controlling device 4 generates a piezoelectric controlling signal S1 to the piezoelectric member 2 to generate vibration with an ultrasonic frequency when start operating the piezoelectric vibrating device 100. When in use, the piezoelectric controlling signal S1 (e.g., high-frequency current) is transmitted to a silver electrode of the piezoelectric member 2, the frequency of which is the same as a resonance frequency of the piezoelectric member 2, and thus it causes that a vibrator of the piezoelectric member 2 resonates to generate ultrasonic wave. Furthermore, it can adjust a frequency of the piezoelectric controlling signal S1 by Operating the piezoelectric controlling device 4 so as to generate a vibration corresponding to the frequency, and each frequency provides with a vibration with a specific polarization direction. In addition, the piezoelectric member 2 has high efficiency of energy transformation and can generate vibration stably in the present invention.

When the piezoelectric vibrating device 100 of the present invention is applied to the ultrasonic devices, e.g. an ultrasonic cleaning device, an ultrasonic welding device, and an emulsifying device (the ultrasonic devices thereof are described as follows), the piezoelectric controlling device 4 transmits the piezoelectric controlling signal S1 to the piezoelectric member 2 by means of operation to generate vibration with specific polarization direction, and the heat energy generated from the vibration of the piezoelectric member 2 is conducted to the wall surface of the metallic containing member 1 through each of the heat dissipating and conducting fins 31 of the heat dissipating and conducting member 3 rapidly.

Figure 2:
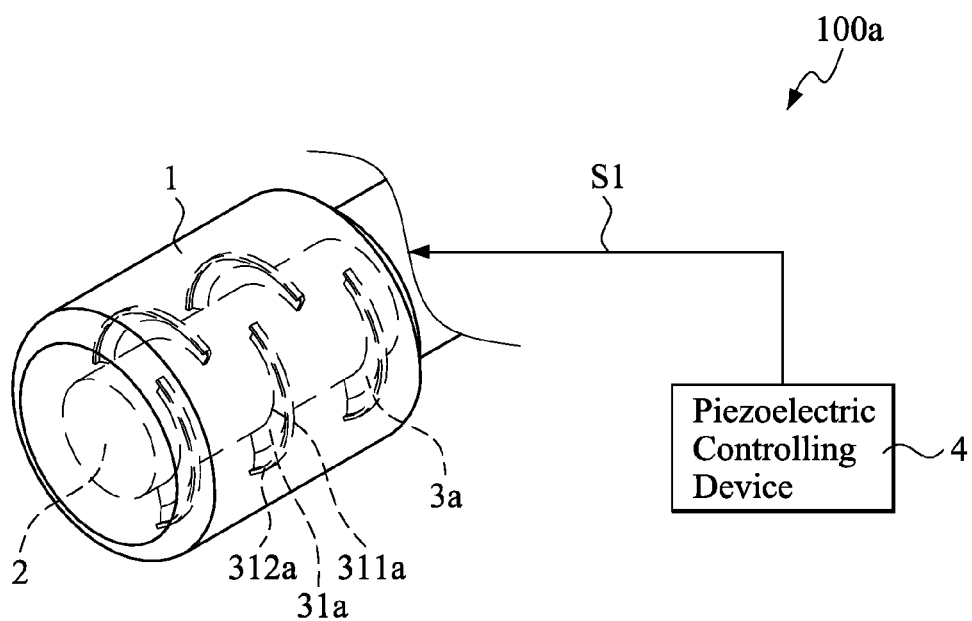
FIG. 2 is a sectional perspective view illustrating another embodiment according to the present invention.

Please refer to FIG. 2, which is a sectional perspective view illustrating another embodiment according to the present invention. The elements of the piezoelectric vibrating device 100a of this embodiment illustrated in this FIG. are similar to those in the above described embodiment. Thus, the elements which have the same function as in the above described embodiment are labeled with the same reference numbers. This embodiment is different from the above described embodiment in as follows. The heat dissipating and conducting fins 31a of the heat dissipating and conducting member 3a are disposed spacing from each other along a helical path on the external surface of the piezoelectric member 2, and each of the heat dissipating and conducting fins 31a has also a first heat conduction connecting end 311a and a second heat conduction connecting end 312a. This arranged structure allows the heat energy generated from the vibration of the piezoelectric member 2 is conducted rapidly to the wall surface of the metallic containing member 1 as well, so as to achieve heat dissipation effect.

Figure 3:
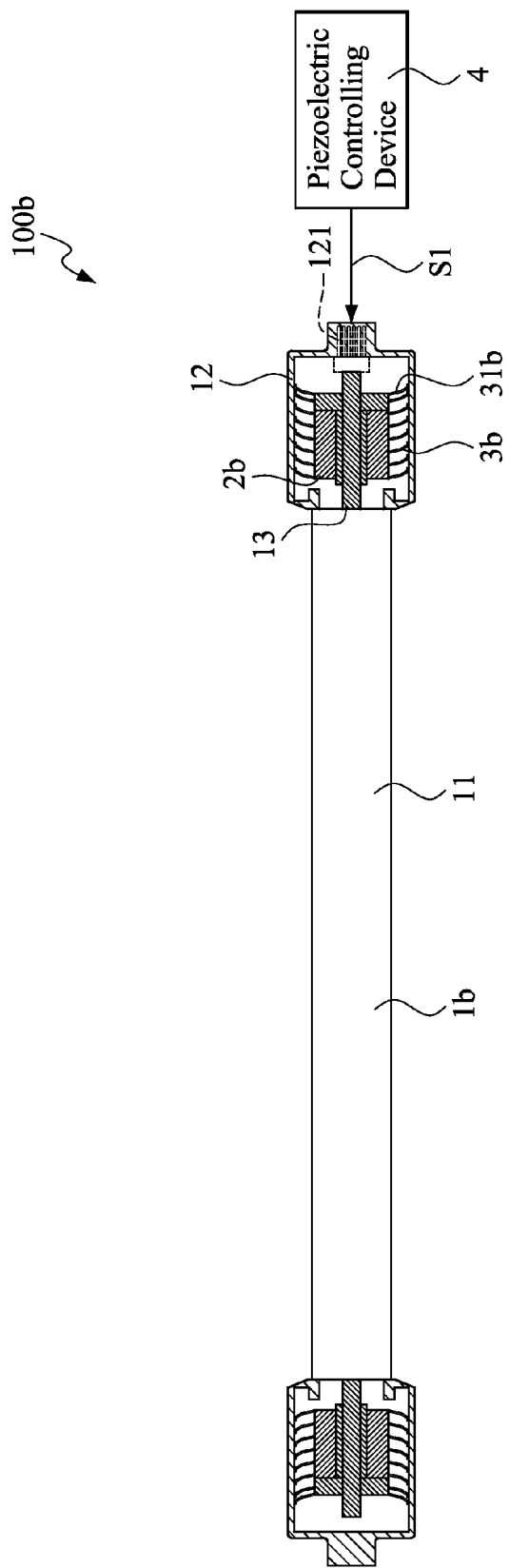
FIG. 3 is a cross-section view illustrating one actual application according to the present invention.
Figure 4:
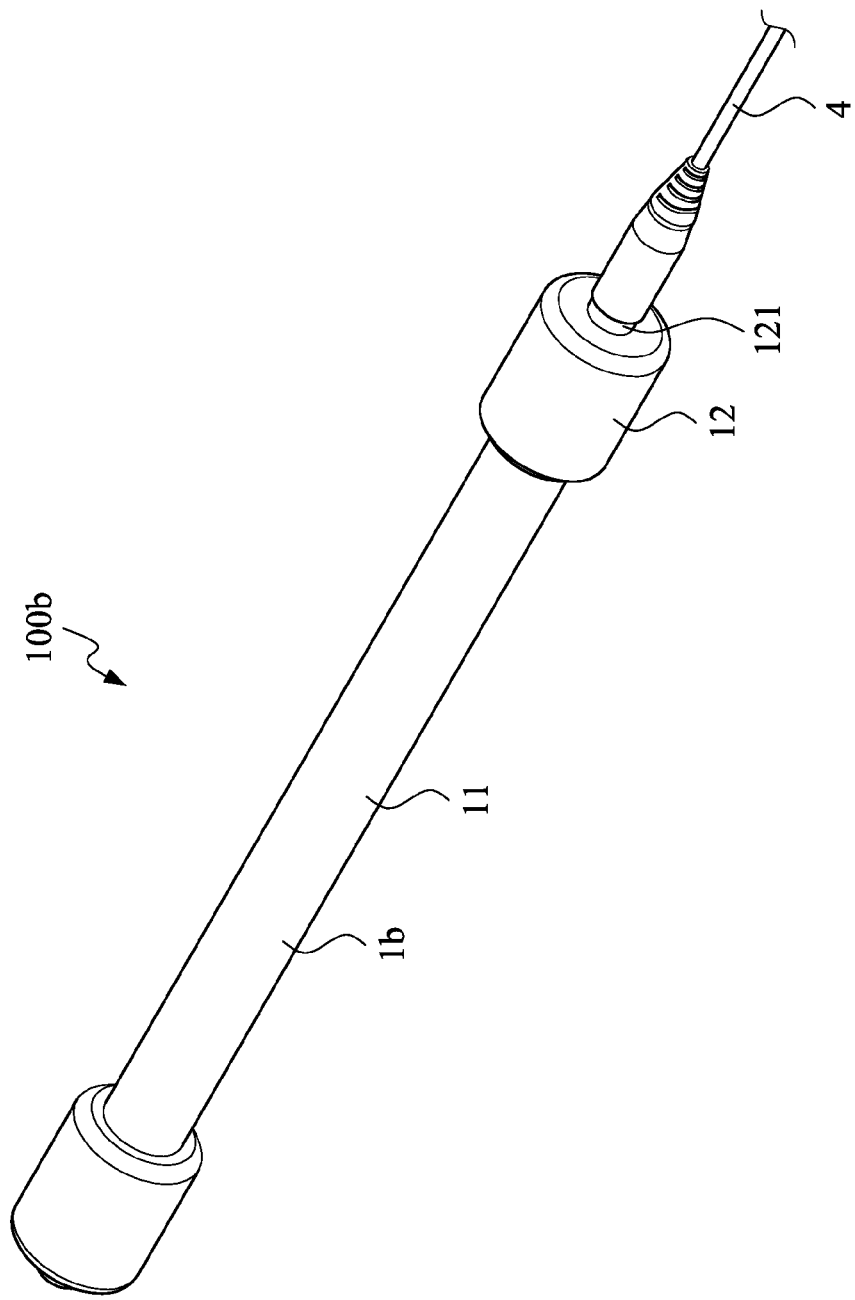
FIG. 4 is a perspective view illustrating one actual application according to the present invention.
Figure 5:
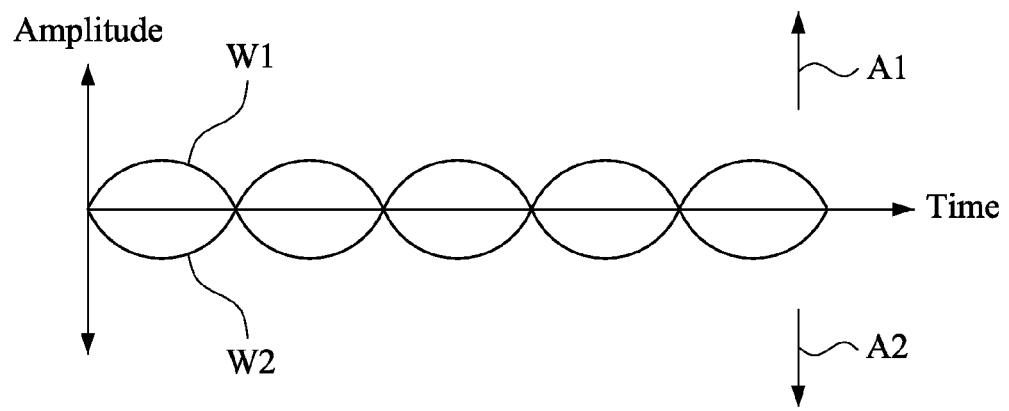
FIG. 5 is a waveform view illustrating one actual application according to the present invention.

Please refer to FIG. 3 to FIG. 5, wherein FIG. 3 is a cross-section view illustrating one actual application according to the present invention, FIG. 4 is a perspective view illustrating one actual application according to the present invention, FIG. 5 is a waveform view illustrating one actual application according to the present invention. The piezoelectric vibrating device 100b as described in this embodiment is an ultrasonic cleaning device having the ultrasonic cleaning function. The metallic containing member 1b includes a metallic connecting part 11 and two metallic containing parts 12 connected respectively with both ends of the metallic connecting part 11, and a conducting member 13 is disposed extending therethrough. Furthermore, the metallic containing member 1b is a tubular metal structure, and the metallic connecting part 11 is a solid structure or a hollow structure.

Both of the piezoelectric members 2b are provided within both of the metallic containing parts 12 respectively. The heat dissipating and conducting members 3b are provided around or disposed spacing from each other on the external surface of the piezoelectric member 2b. Furthermore, the metallic containing part 12 has a connecting plug 121. The piezoelectric controlling device 4 can be plugged to the connecting plug 121, and is thus electrically connected to the piezoelectric member 2b via the conducting member 13, wherein the piezoelectric controlling device 4 can generate the piezoelectric controlling signals S1 and then transmit them respectively to the piezoelectric member 2b so as to control the vibration thereof. In this embodiment, the conducting member 13 not only can transmit the signal as a transmission medium but also connect between the piezoelectric member 2b and the piezoelectric controlling device 4 as an electrical wire (not shown).

When the piezoelectric vibrating device 100b is placed in the cleanout fluid to proceed to ultrasonic cleaning for an object to be cleaned, the piezoelectric controlling device 4 generates the piezoelectric controlling signals S1 by means of operation, and then transmits the piezoelectric controlling signals S1 to the piezoelectric members 2 to generate ultrasonic vibrations respectively.

When both of piezoelectric members 2b receive the piezoelectric controlling signals S1 respectively, the specific polarization direction of the vibration of one of piezoelectric members is a shrunk polarization direction A1, and the specific polarization direction of the vibration of the other of piezoelectric members is an expanded polarization direction A2 as shown in FIG. 5. At the same point of time, both of the oscillatory waves W1, W2 generated from the piezoelectric members 2b have opposite phases, i.e. one is shrunk and the other is expanded as shown in the figure. That is, it causes that both of the different polarization directions result in the diverse oscillation modes to generate superimposition of the different amplitudes of vibration, and thus the more complicated and multi-state vibrating directions can reach the broader and ultra-precious cleaning effects.

The heat energies generated from the vibrations of both of the piezoelectric members 2b are conducted to the wall surface of both of the metallic containing parts 12 of the metallic containing member 1b through each of the heat dissipating and conducting fins 31b of both of the heat dissipating and conducting member 3b, and thus it can dissipate the heat into the fluid so as to discharge it from the heat dissipating and conducting member 3b. In addition, the heat dissipating and conducting member 3b is provided between the piezoelectric member 2b and the inner wall surface of the metallic containing part 12, so the steady arranged structure can effectively overcome the drawback that the ultrasonic wave is unstable because of the heat energy.

Figure 6:
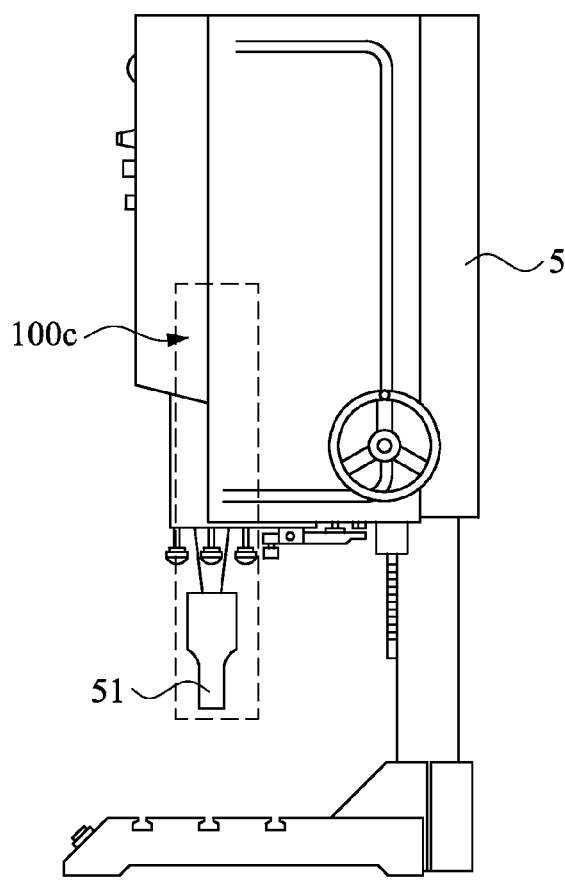
FIG. 6 is a perspective view illustrating another actual application according to the present invention.

Please refer to FIG. 6, which is a perspective view illustrating another actual application according to the present invention. The piezoelectric vibrating device 100c as described in this embodiment is applied to an ultrasonic welding device. The piezoelectric vibrating device 100c is disposed at the location of the ultrasonic welding device 5 as shown in the figure and also has a metallic containing member, a piezoelectric member, a heat dissipating and conducting member, and a piezoelectric controlling device (not shown). It can conduct the heat energy generated from the high speed vibration of the metallic containing member or other auxiliary conducting members to a welding head 51 by controlling of the vibration of the piezoelectric member, and then the welding head 51 gets in touch with a processing part of the plastic work piece at high temperature so as to weld it (not shown).

Figure 7:
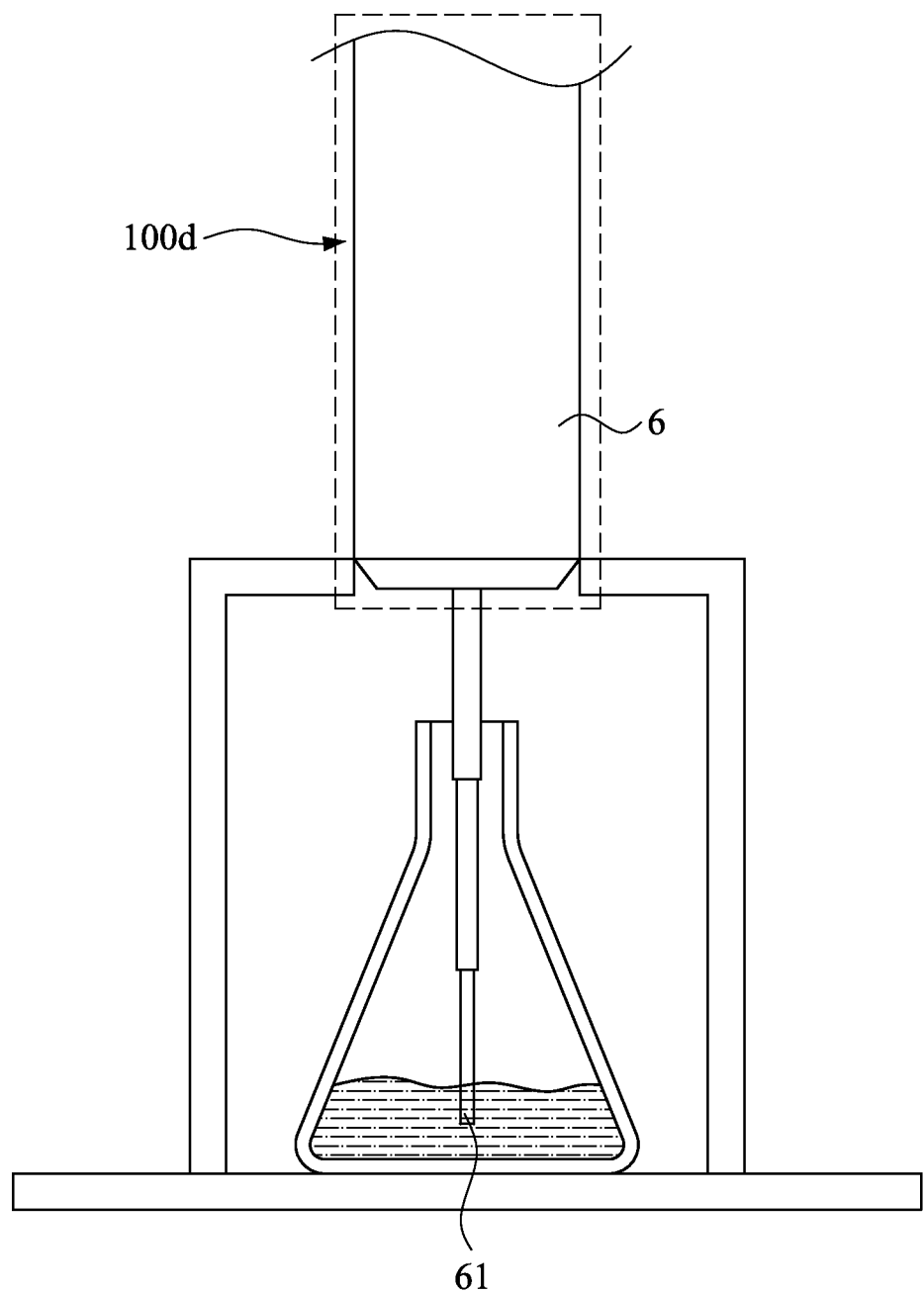
FIG. 7 is a perspective view illustrating still another actual application according to the present invention.

Please refer to FIG. 7, which is a perspective view illustrating still another actual application according to the present invention. The piezoelectric vibrating device 100*d* as described in this embodiment is applied to an emulsifying device. The piezoelectric vibrating device 100*d* is disposed at the location of the emulsifying device 6 as shown in the figure and also has a metallic containing member, a piezoelectric member, a heat dissipating and conducting member, and a piezoelectric controlling device (not shown). By controlling of the high speed vibration of the piezoelectric member, an emulsifying head 61 can convert two immiscible materials, e.g. oil, and solution into an emulsion as high speed vibration and high temperature.

As can be appreciated from the above embodiments, the piezoelectric vibrating device capable of heat dissipation and conduction of the present invention has industry worth which meets the requirement for a patent. The above description should be considered as only the discussion of the preferred embodiments of the present invention. However, a person having ordinary skill in the art may make various modifications to the present invention. Those modifications still fall within the spirit and scope defined by the appended claims.

What is claimed is:

1. A piezoelectric vibrating device capable of heat dissipation and conduction, comprising:
    a metallic containing member;
    a piezoelectric member provided within the metallic containing member;
    a heat dissipating and conducting member including a plurality of heat dissipating and conducting fins, each heat dissipating and conducting fin having a first heat conduction connecting end and a second heat conduction connecting end, the first heat conduction connecting end being provided on an external surface of the piezoelectric member and the second heat conduction connecting end being connected with an inner wall surface of the metallic containing member,
    wherein the piezoelectric member generates a vibration with a specific polarization direction based on a piezoelectric controlling signal, and
    wherein the heat energy generated from the vibration of the piezoelectric member is conducted to the wall surface of the metallic containing member through the heat dissipating and conducting member.

2. The piezoelectric vibrating device capable of heat dissipation and conduction as claimed in claim 1, wherein each of the heat dissipating and conducting fins of the heat dissipating and conducting member is provided around the external surface of the piezoelectric member, and each of the heat dissipating and conducting fins is disposed spacing from an adjacent one with a gap.

3. The piezoelectric vibrating device capable of heat dissipation and conduction as claimed in claim 1, wherein the heat dissipating and conducting fins of the heat dissipating and conducting member are disposed spacing from each other along a helical path on the external surface of the piezoelectric member.

4. The piezoelectric vibrating device capable of heat dissipation and conduction as claimed in claim 1, wherein the piezoelectric member is electrically connected with a piezoelectric controlling device, and the piezoelectric member is controlled by the piezoelectric controlling signal generated from the piezoelectric controlling device.

5. The piezoelectric vibrating device capable of heat dissipation and conduction as claimed in claim 1, wherein the metallic containing member is made from a titanium metal material, a stainless metal material, an aluminum metal material, a copper metal material, or any metal materials with heat conduction.

6. A piezoelectric vibrating device capable of heat dissipation and conduction, comprising:
    a metallic containing member including a metallic connecting part and two metallic containing parts connected respectively with both ends of the metallic connecting part;
    two piezoelectric members provided within the metallic containing parts respectively;
    a heat dissipating and conducting member, provided on an external surface of the piezoelectric member, including a plurality of heat dissipating and conducting fins, each heat dissipating and conducting fin having a first heat conduction connecting end and a second heat conduction connecting end, the first heat conduction connecting end being provided on the external surface of the piezoelectric member and the second heat conduction connecting end being connected with an inner wall surface of the metallic containing part,
    wherein the piezoelectric member generates a vibration with a specific polarization direction based on a piezoelectric controlling signal, and
    wherein the heat energy generated from the vibration of the piezoelectric member is conducted to the wall surface of the metallic containing part through the heat dissipating and conducting member.

7. The piezoelectric vibrating device capable of heat dissipation and conduction as claimed in claim 6, wherein each of the heat dissipating and conducting fins of the heat dissipating and conducting member is provided around the external surface of the piezoelectric member, and each of the heat dissipating and conducting fins is disposed spacing from an adjacent one with a gap.

8. The piezoelectric vibrating device capable of heat dissipation and conduction as claimed in claim 6, wherein the heat dissipating and conducting fins of the heat dissipating and conducting member are disposed spacing from each other along a helical path on the external surface of the piezoelectric member.

9. The piezoelectric vibrating device capable of heat dissipation and conduction as claimed in claim 6, wherein the piezoelectric member is electrically connected with a piezoelectric controlling device, and the piezoelectric member is controlled by the piezoelectric controlling signal generated from the piezoelectric controlling device.

10. The piezoelectric vibrating device capable of heat dissipation and conduction as claimed in claim 6, wherein the specific polarization direction of the vibration of one of piezoelectric members is a shrunk polarization direction and the specific polarization direction of the vibration of the other of piezoelectric members is an expanded polarization direction when both of the piezoelectric members receive the piezoelectric controlling signals simultaneously.

\* \* \* \* \*